United States Patent
Caulfield et al.

[11] Patent Number: 5,757,867
[45] Date of Patent: May 26, 1998

[54] DIGITAL MIXING TO BASEBAND DECIMATION FILTER

[75] Inventors: Robert W. Caulfield, San Diego; Frederick J. Harris, Lemon Grove; William H. McKnight, San Diego, all of Calif.

[73] Assignee: The United States of America as represented by the Secretary of the Navy, Washington, D.C.

[21] Appl. No.: 413,331

[22] Filed: Mar. 30, 1995

[51] Int. Cl.$^6$ .................. H03D 1/04; H03M 3/00
[52] U.S. Cl. .............. 375/350; 375/254; 341/143; 364/724.1
[58] Field of Search ..................... 375/229, 247, 375/316, 350, 242, 254; 341/143; 364/724.1

[56] References Cited

U.S. PATENT DOCUMENTS

| | | |
|---|---|---|
| 4,092,491 | 5/1978 | Frazer. |
| 4,815,136 | 3/1989 | Benvenuto. |
| 4,815,137 | 3/1989 | Benvenuto. |
| 4,857,928 | 8/1989 | Gailus et al.. |
| 4,876,542 | 10/1989 | van Bavel et al.. |
| 5,103,228 | 4/1992 | Voorman et al.. |
| 5,124,705 | 6/1992 | Voorman. |
| 5,150,120 | 9/1992 | Yunus. |
| 5,153,593 | 10/1992 | Walden et al.. |
| 5,243,345 | 9/1993 | Naus et al.. |
| 5,245,344 | 9/1993 | Sooch. |
| 5,283,578 | 2/1994 | Ribner et al.. |
| 5,408,235 | 4/1995 | Doyle et al. ............. 341/143 |
| 5,432,779 | 7/1995 | Shimo et al. ............. 455/85 |
| 5,442,353 | 8/1995 | Jackson .................... 341/143 |
| 5,585,802 | 12/1996 | Cabler et al. ............. 341/143 |
| 5,621,675 | 4/1997 | Linz ......................... 364/724.1 |
| 5,646,621 | 7/1997 | Cabler et al. ............. 341/143 |

OTHER PUBLICATIONS

Harris et al., "On the Performance of Alternate Architectures for Noise Shaping", *ISSPA 92*, 16–21 Aug. 1992.
Harris, "Multirate Digital Signal Processing in Digital Receivers", *DSPCS–94*, 26–29 Apr. 1994.
Harris, "On the Relationship Between Multirate Polyphase Fir Filters and Windowed, Overlapped, FFT Processing", *AACSSC–89*, 30 Oct.—1 Nov. 1989.
Harris et al., "Digital Signal Processing with Efficient Polyphase Recursive All–Pass Filters", *ICSP–91*, 4–6 Sep. 1991.

*Primary Examiner*—Tesfaldet Bocure
*Attorney, Agent, or Firm*—Harvey Fendelman; Michael A. Kagan; Peter A. Lipovsky

[57] ABSTRACT

A digital mixing to baseband decimation filter includes a mixer section and a low-pass filter section. The mixer section generates in-phase and quadrature signal components at baseband from low-resolution, high-rate digital data lying within a signal passband offset from baseband. The low-pass filter section transforms an incoming data stream to high-resolution, low-rate digital data. The mixer section can precede or follow the filter section.

14 Claims, 2 Drawing Sheets

DIGITAL MIXING TO BASEBAND DECIMATION FILTER

CROSS-REFERENCE TO RELATED PATENT APPLICATIONS

This patent application is co-pending with two related patent applications entitled "Sigma-Delta Modulator With Tunable Signal Passband" (Ser. No. 08/384,819 filed 31 Jan. 1995, now issued as U.S. Pat. No. 5,736,950 on Apr. 7, 1998. This issued patent is incorporated by reference herein.

DOCUMENTS INCORPORATED BY REFERENCE

The following documents are incorporated by reference into this specification: "On the Performance of Alternate Architectures for Noise Shaping Modulators of the Sigma-Delta Type", Proceedings of the International Symposium on Signal Processing and its Applications (ISSPA-92), Gold Coast, Australia, Aug. 16–21, 1992 by Fred Harris and Bill McKnight; "Multirate Digital Signal Processing in Digital Receivers," Proceedings of the Second International Symposium on Digital Signal Processing for Communications Systems (DSPCS-94), Adelaide, Australia, Apr. 26–29, 1994 by Fred Harris; "On the Relationship Between Multirate Polyphase FIR Filters and Windowed, Overlapped, FFT Processing", Proceedings from the 23rd Annual Asilomar Conference on Signals, Systems and Computers, Pacific Grove, Calif., Oct. 30–Nov. 1, 1989, by Fred Harris; and "Digital Signal Processing with Efficient Polyphase Recursive All-Pass Filters", presented at the International Conference on Signal Processing, Florence, Italy, Sep. 4–6, 1991, by Fred Harris, Maximilien d'Oreye de Lantremange and A. G. Constantinides.

FIELD OF THE INVENTION

The present invention relates to the field of filters, and more particularly, but without limitation thereto, to a decimation filter for transforming low-resolution, high-rate digital data to high-resolution, low-rate digital data when the low-resolution, high-rate digital data is within a signal passband offset from d.c. or baseband.

BACKGROUND OF THE INVENTION

The general purpose of a decimation filter is to transform low-resolution, high-rate digital data to high-resolution, low-rate digital data. The decimation filter following a sigma-delta modulator configured for analog-to-digital (A/D) conversion has traditionally functioned as a low-pass filter where the high frequency quantization noise from the sigma-delta modulator is filtered out and the lower frequency signal is allowed to pass. However, if the sigma-delta modulator outputs a low-resolution, high-rate digital signal occupying an intermediate band of frequencies offset from d.c., the prior art decimation filters are not able to properly transform the low-resolution, high-rate digital data to high-resolution, low-rate digital data. Thus, a need exists for a decimation filter that can operate on low-resolution, high-rate digital data that occupies an intermediate band of frequencies offset from d.c.

SUMMARY OF THE INVENTION

In accordance with the present invention, a digital mixing to baseband decimation filter is provided. This decimation filter, when used in A/D conversion, will typically follow a sigma-delta modulator that generates low-resolution, high-rate digital data within a signal passband offset from baseband. The decimation filter includes a digital mixer that generates in-phase digital signal components at baseband and quadrature digital signal components at baseband, both of these taken from the low-resolution, high-rate digital data of the sigma-delta modulator. Low-pass down-sampling filters are coupled to the mixer for transforming both the in-phase and quadrature digital signal components at baseband to high-resolution, low-rate digital data. The mixing operation can be performed in a physical mixer distinct from the low-pass filters or can be performed by an aliasing operation through various combinations of resampling, filtering and complex heterodyne.

DESCRIPTION OF THE PREFERRED EMBODIMENT

Figure 1:
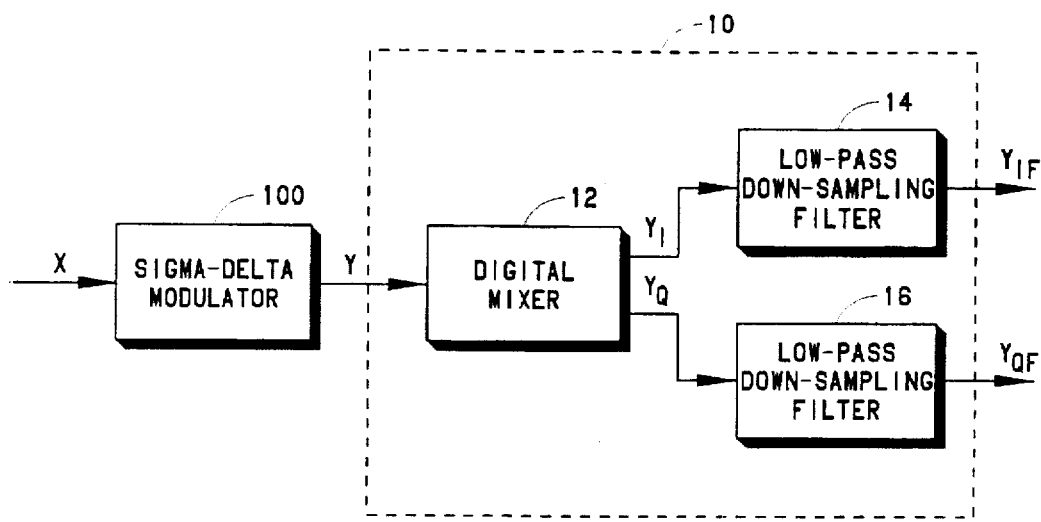
FIG. 1 is a block diagram of an analog-to-digital (A/D) converter based on a sigma-delta modulator and the digital mixing to baseband decimation filter of the present invention.

Referring now to the drawings, and more particularly to FIG. 1, a block diagram is shown of an analog-to-digital (A/D) converter in which decimation filter 10 is connected to the output Y of sigma-delta modulator 100. In terms of A/D conversion, sigma-delta modulator 100 operates on an oversampled analog input X to output quantized or digital signal Y. For purposes of the present invention, it will be assumed that output Y of sigma-delta modulator 100 is a bandpass signal whose power is confined to a spectral region or signal passband offset from d.c. and in which the quantization noise has been suppressed. The amount of offset is typically referenced from the center frequency of the signal passband.

The output of sigma-delta modulator 100 is a low-resolution (e.g., 1 to 4-bits) data stream having a high sample rate (e.g., typically 16 to 64 times the Nyquist rate). One such sigma-delta modulator that also includes the ability to be tuned to a selected passband is disclosed in detail in the aforementioned co-pending patent application entitled "Sigma-Delta Modulator With Tunable Signal Passband". Decimation filter 10 transforms the low-resolution data stream into a multi-bit high resolution (e.g., typically 12 to 16 bits or more) data stream at a lower data rate (e.g., typically 1 to 2 times the Nyquist rate). Filter 10 also filters out noise which could be aliased back into the signal passband of sigma-delta modulator 100.

Decimation filter 10 includes digital mixer 12 and low-pass down-sampling filters 14 and 16 to operate on the quantized or digital output Y. At the digital level, mixer 12 generates an in-phase signal component $Y_I$ and a quadrature signal component $Y_Q$, both of which are at baseband. Once at baseband, filters 14 and 16 can respectively reduce the sample or data rate and attenuate the quantization noise associated with the in-phase signal component $Y_I$ and quadrature signal component $Y_Q$.

Figure 2:
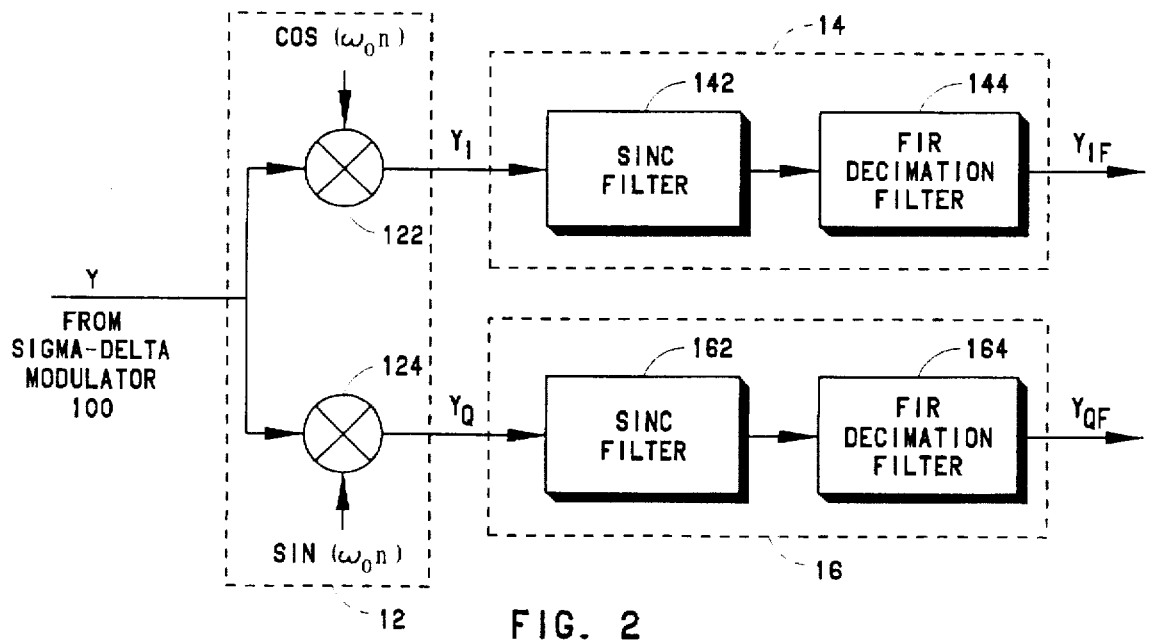
FIG. 2 is a block diagram of the digital mixing to baseband decimation filter according to a preferred embodiment of the present invention.

By way of example, FIG. 2 represents one embodiment for implementing digital mixer 12 and each of low-pass down-sampling filters 14 and 16. In particular, mixer 12 heterodynes and forms in-phase signal component $Y_I$ to baseband by multiplying the output Y of sigma-delta modulator 100 by cos $\omega_0 n$ at multiplier 122. Here, $\omega_0$ is the normalized radian center frequency of the signal passband in units of radians per sample and n=0, 1, 2, . . . In a complementary fashion, mixer 12 heterodynes and forms quadrature signal component $Y_Q$ to baseband by multiplying the output Y of sigma-delta modulator 100 by sin $\omega_0 n$ at multiplier 124. Thus, mixer 12 translates the digital data in the signal passband of sigma-delta modulator 100 to baseband.

The low-pass down-sample filtering provided by filters 14 and 16 can be accomplished in any one of a variety of ways and can be identical for in-phase signal component $Y_I$ and quadrature signal component $Y_Q$. Accordingly, only filter 14 will be described below.

An efficient method of low-pass digital decimation filtering is disclosed by E. B. Hogenauer in "An Economical Class of Digital Filters for Decimation and Interpolation", IEEE Transactions On Acoustic Speech Signal Processing, Vol. ASSP. 29, No. 2, pp. 155–162, April 1981. Briefly, as disclosed by Hogenauer, filter 14 is a cascade structure composed of one or more stages of decimating SINC filter 142 described below and decimating FIR (finite impulse response) filter 144. SINC is the standard vernacular for a digital filter having the following transfer function in the Z-domain $$\frac{(1-Z^{-N})}{(1-Z^{-1})}$$

where N is a whole number. The digital frequency response of a SINC filter is $$\sin\left(\frac{N\theta}{2}\right) / \sin\left(\frac{\theta}{2}\right)$$

where $\theta$ is a digital frequency in radians per sample. Implementation of such a SINC filter is discussed in detail by F. Harris et al. in "On the Performance of Alternate Architectures for Noise Shaping Modulators of the Sigma-Delta Type", Proceedings of the International Symposium on Signal Processing and its Applications (ISSPA-92), Gold Coast, Australia, Aug. 16–21, 1992, incorporated by reference herein. Briefly, although not shown, decimating SINC filter 142 is typically implemented by means of a comb pre-filter, an M-to-1 decimation process and a matching number of differentiators.

In operation, SINC filter 142 begins the process of attenuating quantization noise above the signal passband which, for the present invention, is now located at baseband. In addition, SINC filter 142 is used to reduce the sample rate of the digital data being processed commensurate with the bandwidth reduction of the filtering process. The output of SINC filter 142 is presented to decimating FIR filter 144 which: 1) improves output resolution by further reducing the noise bandwidth, and 2) reduces the output sample rate commensurate with bandwidth reduction. The output of decimation filter 10 is a combination of the filtered in-phase signal component $Y_{IF}$ and the filtered guadrature signal component $Y_{QF}$.

Although the invention has been described relative to a specific embodiment thereof, there are numerous variations and modifications that will be readily apparent to those skilled in the art in light of the above teachings. In particular, both the mixing and low-pass filtering can be implemented in a variety of ways known in the art.

Several alternative methods of decimation filtering, spectral translation and down-sampling are presented by F. Harris in "Multirate Digital Signal Processing in Digital Receivers," Proceedings of the Second International Symposium for Digital Signal processing for communications Systems (DSPCS-94), Adelaide, Australia, Apr. 26–29, 1994, incorporated by reference herein. For example, as described in reference to FIG. 2, the signal spectrum can be translated to baseband with a complex heterodyne producing a complex series that could then be filtered with a pair of low-pass decimation filters. The decimation filters can be any combination of recursive or non-recursive structures. Re-sampling can either occur after the filtering process, within the filtering process (e.g., cascade re-samplers), or prior to the filtering process (e.g., polyphase filters). However, the spectral translation of the sigma-delta modulator's binary output series converts the series into samples of sines and cosines thereby requiring wider bit fields. Consequently, the arithmetic operations following the spectrum translation are complex.

The mixing/filtering function could also be achieved by: translating the passband of low-pass filters 14 and 16 to the center of the signal spectrum. This can be done by the process of: modifying the filter weights of a reference filter centered at baseband to shift the center frequency of the reference filter; filtering the band-centered sigma-delta modulator output series at its center frequency; performing most of the spectral translation by re-sampling the filter output; and absorbing any residual spectral translation by a standard complex heterodyne at the reduced output sample rate. The pre-processing modification of the filter weights of the reference filter can be performed by a low-pass to bandpass transformation of recursive filters or by any spectral translation option available for non-recursive filters. Such options include, but are not limited to, a complex heterodyne of a low-pass reference filter and the use of a Remez multiple exchange algorithm to design the desired bandpass filter. This at-center frequency filtering option is desirable because the input data is the binary output of the sigma-delta modulator and the arithmetic for the first stage of any filtering process can be performed without multiplications.

Still further, the mixing/filtering function can be achieved by polyphase filtering the input time series with a multiple path (M-path), re-sampled low-pass or re-sampled bandpass filter. Such filters use intentional structured aliasing to perform the spectral translation of the desired passband prior to filtering and then recover the desired alias component by phase coherent summation of the polyphase time series.

Figure 3:
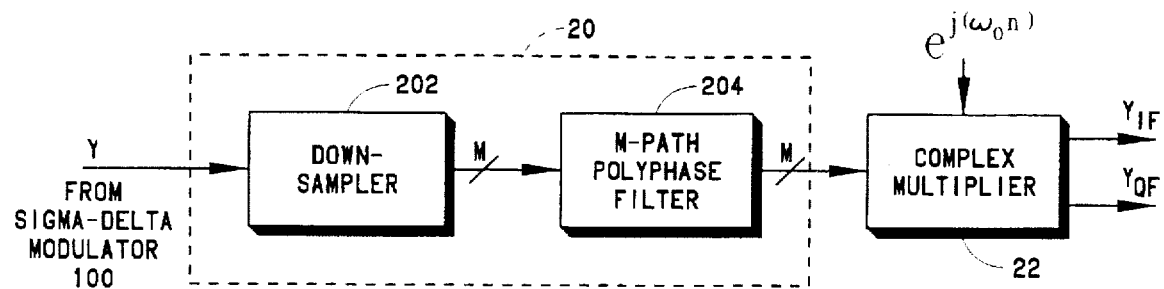
FIG. 3 is a block diagram of another embodiment of the present invention in which the sampling rate of the signal bandwidth is reduced by one down-sampling operation prior to heterodyning (mixing)

The heterodyne process provided by mixer 12 can also occur after the sampling rate has been returned to the Nyquist rate by a single filter or by a staged filter. For example, as shown in FIG. 3, the one-bit data stream output from sigma-delta modulator 100 is applied to single-stage multirate downsampling filter 20 which includes down-sampler 202 and M-path polyphase filter 204. In this configuration, the input data stream is commutated by down-sampler 202 to "M" sub-filters arranged in the M-path architecture of filter 204. The architecture of filter 204 includes polyphase partitions of traditional FIR filters as well as recursive all-pass structures so that spectral data is intentionally aliased. This destructively cancels the undesired spectral terms while permitting coherent or constructive summation (at complex multiplier 22) of the desired spectral term by applying complex phase rotations to the partial sums formed by the M-path filters. The interchange of the order of filtering and resampling to the order of resampling and filtering is known as the NOBLE IDENTITY interchange. Structures permitting the NOBLE IDENTITY interchange are discussed by F. Harris in "On the Relationship Between Multirate Polyphase FIR Filters and Windowed, Overlapped, FFT Processing", Proceedings from the 23rd Annual Asilomar Conference on Signals, Systems and Computers, Pacific Grove, California, Oct. 30–Nov. 1, 1989, incorporated by reference herein, and by F. Harris et al. in "Digital Signal Processing with Efficient Polyphase Recursive All-Pass Filters", presented at the International Conference on Signal Processing, Florence, Italy, Sep. 4–6, 1991, incorporated reference herein.

Figure 4:
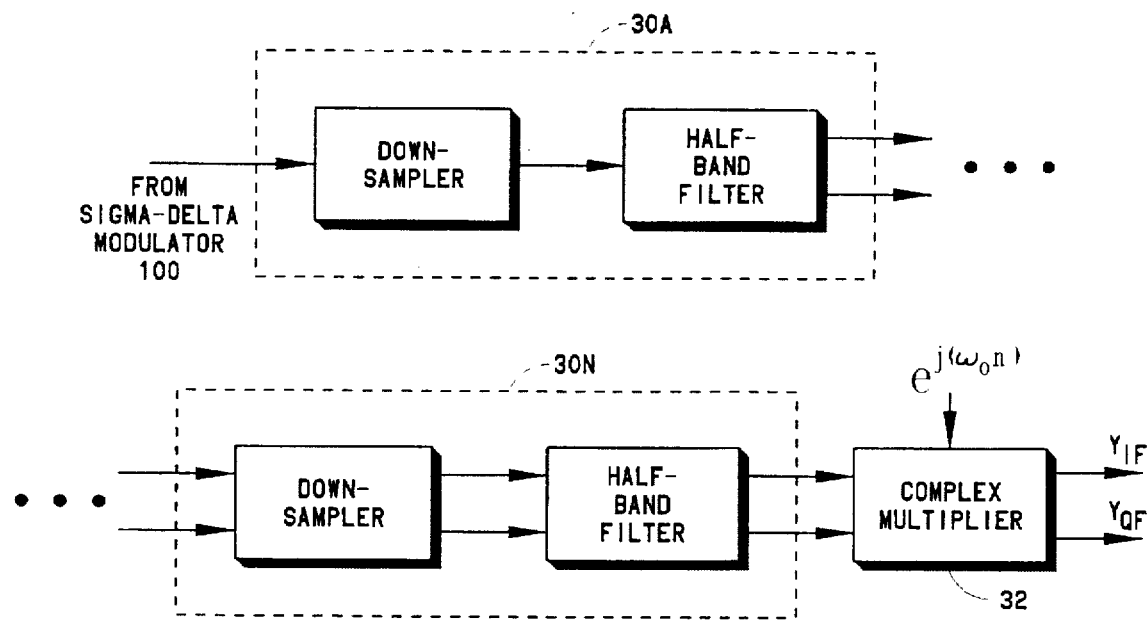
FIG. 4 is a block diagram of still another embodiment of the present invention in which the sampling rate of the signal bandwidth is reduced by a staged down-sampling operation prior to heterodyning.

Alternatively, as in the embodiment shown in FIG. 4, the one-bit data stream output from sigma-delta modulator 100 can be applied to stages of half-band filters and down samplers 30A . . . 30N. The half-band filters and down-samplers associated with each stage suppress the quantization noise and reduce the sampling frequency by a factor of two. The order of the filter in each stage is minimized so that only inconsequential aliasing of quantization noise occurs, i.e., only quantization noise that would alias into the signal band is suppressed. Since down sampling causes a passband signal to move through the Nyquist interval, the type of filter required for each stage depends on the location of the signal band within the Nyquist interval. After down sampling has been completed by stages 30A . . . 30N, the signal band is heterodyned to baseband at the lower sampling frequency by complex multiplier 32. As in the preferred embodiment, the output is a combination of the filtered in-phase signal component $Y_{IF}$ and the filtered quadrature signal component $Y_{QF}$.

It is therefore to be understood that, within the scope of the appended claims, the invention may be practiced other than as specifically described.

What is claimed as new and desired to be secured by Letters Patent of the United States is:

1. An apparatus comprising:
a sigma-delta modulator for generating low-resolution, high-rate digital data within a signal passband offset from baseband;
a down-sampler for commutating said low-resolution, high-rate digital data, said down-sampler generating commutated low-resolution, high-rate digital data;
an M-path polyphase filter coupled to said down-sampler for converting said commutated low-resolution, high-rate digital data into high-resolution, low-rate digital data and for selectively phase shifting said high-resolution, low-rate digital data so that phase shifted data falling within said signal passband is added constructively and so that phase shifted data falling outside of said signal passband is added destructively, said M-path polyphase filter outputting constructively added phase shifted data; and
a complex multiplier coupled to said M-path polyphase filter for transforming said constructively added phase shifted data to baseband from said signal passband.

2. The apparatus of claim 1 in which in-phase and quadrature signal components at baseband are generated from said constructively added phase shifted data, and in which said in-phase and quadrature signal components are generated by multiplying said constructively added phase shifted data by $$e^{j(\omega_0 n)},$$

wherein $\omega_0$ is the center frequency of said signal passband and n is a whole number.

3. An apparatus comprising:
a down-sampler for commutating low-resolution, high-rate digital data, said down-sampler generating commutated low-resolution, high-rate digital data;
an M-path polyphase filter coupled to said down-sampler for converting said commutated low-resolution, high-rate digital data into high-resolution, low-rate digital data and for selectively phase shifting said high-resolution, low-rate digital data so that phase shifted data falling within said signal passband is added constructively and so that phase shifted data falling outside of said signal passband is added destructively; and
a complex multiplier coupled to said M-Path polyphase filter for transforming said constructively added phase shifted data into in-phase and quadrature signal components at baseband.

4. The apparatus of claim 3 in which said in-phase and quadrature signal components at baseband are generated by multiplying said constructively added phase shifted data by $$e^{j(\omega_0 n)},$$

wherein $\omega_0$ is the center frequency of said signal passband and n is a whole number.

5. A method comprising:
generating low-resolution, high-rate digital data within a signal passband offset from baseband;
converting said low-resolution, high-rate digital data to high-resolution, low-rate digital data;
selectively phase shifting said high-resolution, low-rate digital data so that phase shifted data falling within said signal passband is added constructively and so that phase shifted data falling outside of said signal passband is added destructively; and
transforming said constructively added phase shifted data to baseband.

6. An apparatus comprising:
a sigma-delta modulator for generating low-resolution, high-rate digital data within a signal passband offset from baseband;
a combination down-sampler and half-band filter stage coupled to said sigma-delta modulator for selectively filtering and down-sampling said low-resolution, high-rate digital data to provide filtered high-resolution, low-rate digital data; and
a complex multiplier coupled to said combination down-sampler and half-band filter stage for transforming said filtered high-resolution, low-rate digital data to baseband from said signal passband.

7. The apparatus of claim 6 in which said complex multiplier transforms said filtered high-resolution, low-rate digital data into in-phase and quadrature signal components at baseband.

8. The apparatus of claim 7 in which said in-phase and quadrature signal components are generated by multiplying said filtered high-resolution, low-rate digital data by $$e^{j(\omega_0 n)},$$

wherein $\omega_0$ the center frequency of said signal passband and n is a whole number.

9. The apparatus of claim 6 in which said combination down-sampler and half-band filter stage is one of a plurality of combination down-sampler and half-band filter stages coupled in series between said sigma-delta modulator and said complex multiplier.

10. The apparatus of claim 9 in which said complex multiplier transforms said filtered high-resolution, low-rate digital data into in-phase and quadrature signal components at baseband.

11. The apparatus of claim 10 in which said in-phase and quadrature signal components are generated by multiplying said filtered high-resolution, low-rate digital data by $$e^{j(\omega_0 n)},$$

wherein $\omega_0$ is the center frequency of said signal passband and n is a whole number.

12. A method comprising:

generating low-resolution, high-rate digital data within a signal passband offset from baseband;

selectively down-sampling and filtering said low-resolution, high-rate digital data to generate filtered high-resolution, low-rate digital data; and complex heterodyning said filtered high-resolution, low-rate digital data to transform said filtered high-resolution, low-rate digital data from said signal passband to baseband.

13. The method of claim 12 in which said complex heterodyning includes generating in-phase and quadrature signal components at baseband.

14. The method of claim 13 in which said in-phase and quadrature signal components are generated by multiplying said filtered high-resolution, low-rate digital data by $$e^{j(\omega_0 n)},$$

wherein $\omega_0$ is the center frequency of said signal passband and n is a whole number.

* * * * *